INVENTOR
CHARLES O. FORGE
VICTOR E. VAN DUZER
BY J. C. Chapman
ATTORNEY

Feb. 5, 1963 V. E. VAN DUZER ET AL 3,076,902

PULSE CIRCUITS USING DIFFUSED JUNCTION SEMICONDUCTOR DEVICES

Filed March 30, 1961 2 Sheets-Sheet 2

INVENTORS
CHARLES O. FORGE
VICTOR E. VAN DUZER
BY J. C. Chognard
ATTORNEY

United States Patent Office 3,076,902

Patented Feb. 5, 1963

3,076,902

PULSE CIRCUITS USING DIFFUSED JUNCTION SEMICONDUCTOR DEVICES

Victor E. Van Duzer, Mountain View, and Charles O. Forge, Cupertino, Calif., assignors to Hewlett-Packard Company, Palo Alto, Calif., a corporation of California Filed Mar. 30, 1961, Ser. No. 99,522
6 Claims. (Cl. 307—88.5)

This invention relates to pulse circuits and more particularly to an output circuit for a pulse generator and which generates sharp pulses having very fast rise and fall times.

Sharp pulses of controllable duration and repetition rate may be used to test the response of high frequency amplifiers, nuclear equipment, filters, and other electronic apparatus. These pulses may be produced by conventional means, such as mechanical switching devices or generators of a transmission-line type. The rise and fall times of pulses produced by these methods are usually of the order of one to ten millimicroseconds. Generators of this type are discussed in the literature. (See Lewis & Wells, Millimicrosecond Pulse Techniques, chapter 4, Pergamon Press, New York, 1959.) These conventional methods, however, are usually inadequate for generating pulses of controllable duration and repetition rate and having rise and fall times of the order of a fraction of a millimicrosecond.

In general, pulses having very fast rise and fall times and which are provided by a pulse source, may not have sufficient power or suitable impedance level for application to a load circuit. In these situations, an output circuit may be used to increase the pulse power and transform the impedance level to values which are suitable for a particular load circuit. However, output circuits which are connected to receive the pulses tend to distort or destroy the pulse shape when the rise and fall times thereof are very short. It is desirable, then, to produce pulses having very fast rise and fall times and which do not require amplifier stages to increase the pulse power or transform the impedance level. Pulses thus produced can be applied directly to the load circuit with adequate power and proper impedance level. In addition, the pulses can be applied to the load circuit without amplifiers and concomitant distortion.

It is therefore an object of the present invention to provide a pulse generating circuit which is capable of applying to a load circuit pulses having rise and fall times of the order of a fraction of a millimicrosecond.

It is another object of the present invention to provide a pulse generating circuit which can provide output pulses having rise and fall times of the order of a fraction of a millimicrosecond and having controllable duration and repetition rate.

This invention makes use of the discontinuity in the reverse conduction current of certain graded junction diodes to shape the leading and trailing edges of the output pulse. The discontinuity in the reverse conduction of the diodes occurs when the supply of carriers stored in the vicinity of the junction during forward conduction is suddenly depleted. This discontinuity appears as a very fast rate of change of the reverse current which is much faster, in fact, than the rate of change in the current applied to the diode.

Other and incidental objects of the present invention will be apparent from a reading of this specification and an inspection of the accompanying drawing in which.

Figure 1:
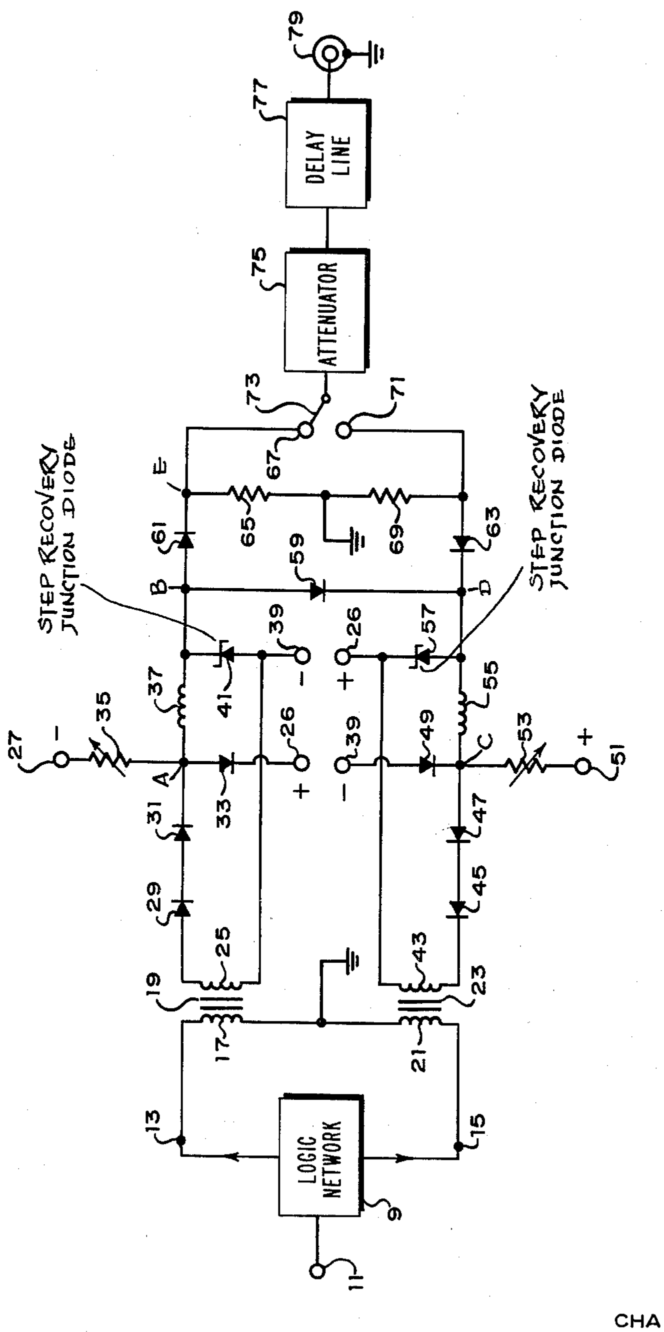
FIGURE 1 is a schematic diagram of the circuit of the present invention.

Referring now to the circuit of FIGURE 1 there is shown a logic network 9 with input terminal 11 and output terminals 13 and 15. Primary winding 17 of transformer 19 is connected between output terminal 13 and ground. Primary winding 21 of transformer 23 is connected between output terminal 15 and ground. One terminal of secondary winding 25 on transformer 19 is connected to a low positive supply voltage 26 through serially connected diodes 29, 31, and 33. The common terminal of serially connected diodes 31 and 33 is connected through resistor 35 to a high negative supply voltage 27, and is connected to one terminal of inductor 37. The other terminal of winding 25 is connected to a low negative supply voltage 39 and is connected to the other terminal of inductor 37 through junction diode 41. One terminal of secondary winding 43 on transformer 23 is connected to the low negative supply voltage 39 through serially connected diodes 45, 47, and 49. The common terminal of diodes 47 and 49 is connected to a high positive supply voltage 51 through resistor 53 and is connected to one terminal of inductor 55. The other terminal of winding 43 is connected to the low positive supply voltage 26 and is connected to the other terminal of inductor 55 through junction diode 57. The common terminal of inductor 37 and junction diode 41 is connected to one terminal of diode 59 and to the corresponding terminal of diode 61. The other terminal of diode 61 is connected through resistor 65 to ground and is connected to the first position 67 of the single pole, double throw switch 73. The common terminal of inductor 55 and junction diode 57 is connected to the other terminal of diode 59 and to the corresponding terminal of diode 63. The other terminal of diode 63 is connected through resistor 69 to ground and is connected to the second position 71 of switch 73. The common pole 73 of the co-axial switch is connected through attenuator 75 and delay line 77 to the output terminal 79.

In operation, diodes 29, 31 and 33 are reverse biased in the absence of applied signal at winding 17. Junction diode 41 is connected to conduct forward bias current through inductor 37 and resistor 35 in the absence of signal on winding 17. The two diodes 29 and 31 provide a higher peak inverse breakdown voltage and insure reverse biasing in the presence of the forward conduction voltage drop across diode 41. Diode 41 is a diffused junction semiconductor device which has about its junction a gradient of impurity concentration that increases rapidly with distance. This type of diode is described in pending application No. 27,943, filed May 9, 1960, by Albert Frank Boff et al. These diodes are believed to store carriers in the vicinity immediately adjacent to the junction during forward conduction, and exhibit a sudden depletion of the stored carriers during the subsequent reverse conduction, which depletion occurs in a time considerably shorter than the carrier lifetime. Diodes 59 and 61 are also connected to be reverse biased in the absence of signal at winding 17.

The logic network 9 produces a pulse at output terminal 13 in response to an input signal on terminal 11. This pulse is coupled through transformer 19 to the diodes 29, 31 and 33 with sufficient amplitude and polarity to forward bias the diodes. Diode 33 is thus rendered conductive and the amplitude of the pulse is limited to the value of the positive supply voltage 26. The increased amplitude of the voltage across resistor 35 appears instantaneously across inductor 37. The supply of carriers stored in the vicinity of the junction diode 41 is depleted as reverse conduction current through the inductor 37 increases. The current through inductor 37 continues to increase with time until the supply of carriers stored in junction diode 41 during the forward conduction is depleted. The sudden depletion causes the voltage across the diode 41 to increase to a maximum value in a time that is less than a millimicrosecond. This increase in voltage initiates an output pulse and renders diodes 59 and 61 conductive. The change in voltage is thereby applied through the switch 73, attenuator 75, and delay line 77 to the output terminal 79.

After a predetermined time, logic network 9 produces an output pulse at output terminal 15. This pulse is applied through transformer 23 to the back-biased diodes 45, 47 and 49. This signal is applied with sufficient amplitude and polarity to forward bias the diodes. The amplitude of the signal is thus clamped to the value of the negative supply voltage 39. In a manner as previously described for junction diode 41, the carriers which were stored in the immediate vicinity of the junction of junction diode 57, are depleted as the reverse current through conductor 55 continues to increase with time. When the supply of carriers is suddenly depleted, an abrupt change in the amplitude of the voltage across junction diode 57 occurs, which change takes place in a time that is less than a fraction of a millimicrosecond. The current which flows in resistor 65 owing to the output pulse then flows through forward conducting diode 59 toward the junction diode 57. This causes diode 61 to become non-conductive and causes junction diode 41 to return to the forward bias condition. The trailing edge of the pulse is thereby established and is applied to the output terminal 79 through the switch 73, attenuator 75, and delay line 77.

A short time later, the pulse appearing at terminal 13 is removed and diodes 29, 31 and 33 become back biased. After a predetermined time, the pulse appearing at output terminal 15 is also removed and diodes 45, 47 and 49 become back biased. Junction diode 57 then returns to the forward biased condition and, since diode 59 is in the reverse biased condition, the change in voltage across junction diode 57 is not applied to the output terminal 79.

The delay line 77 has a two-way delay time that is greater than the maximum separation of signals appearing at the output of logic circuit 9. This insures that diode 61, which is forward biased by the leading edge of the pulse and reverse biased by the trailing edge of the pulse, will be in the non-conductive state by the time the reflection returns from a mismatched load circuit. In this manner, the effect of the reflection from the load circuit upon the pulse circuit is greatly reduced.

Resistor 65 has a value that is substantially equal to the characteristic impedance of delay line 77. If the load circuit which is connected to output terminal 79 does not properly terminate the delay line 77, then a reflected wave from the load circuit will result. These reflections, travelling from the load circuit to the pulse source, are thereby terminated in the characteristic impedance 65. Attenuator 75 is provided to reduce the amplitude of pulses appearing at output terminal 79 to any convenient value.

The operation of the circuit as previously described produces a pulse of positive polarity at output terminal 79. The pulses, initiated by junction diode 41 and terminated by junction diode 57, are applied through diode 61 and switch 73 in the proper position to the output terminal 79. The circuit may also be operated to produce a pulse of the output terminal 79 of negative polarity. Negative output pulses are obtained when logic circuit 9 is operated to produce a pulse at output terminal 15 prior to the appearance of a pulse at terminal 13. In this manner, junction diode 57 serves to initiate an output pulse and junction diode 41 serves to terminate the output pulse. Switch 73 is connected to pole 71. The negative pulse is thus applied to output terminal 79 through diode 63.

Figure 2:
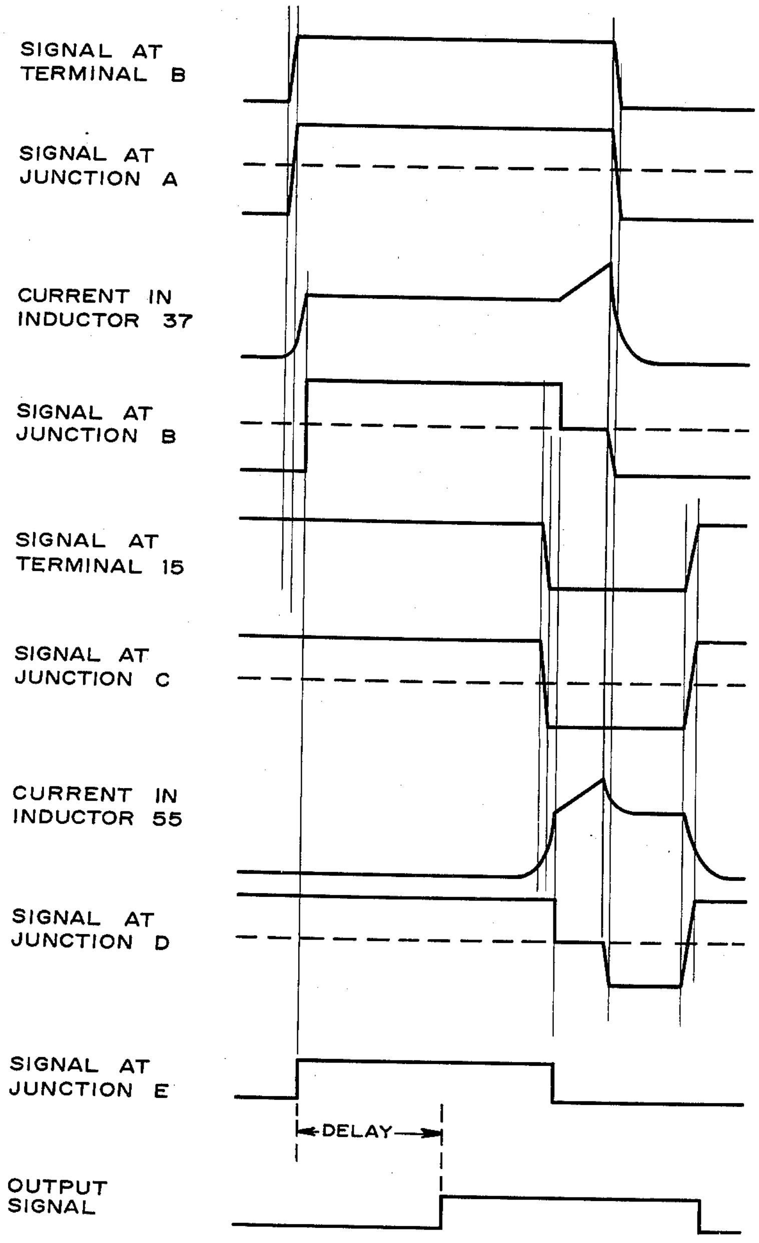
FIGURE 2 is a graph showing various operating waveforms for the circuit of FIGURE 1.

The graph of FIGURE 2 shows the various waveforms produced when the circuit of FIGURE 1 is operated to provide positive polarity output pulses having maximum pulse duration. The waveforms shown are in simplified form for purposes of clarity and ease of comprehension and thus only show transient times where necessary.

Therefore, the circuit of the present invention provides sharp pulses of controllable duration and repetition rate and having rise and fall times of the order of a fraction of a millimicrosecond. In addition, the shape of the pulses produced by the present invention does not depend upon the proper termination of the output. By using a delay line in the output circuit of the present invention, the reflections which return from mismatched load circuit are delayed for a predetermined time during which the pulse circuits are disconnected from the output terminal. The reflections that propagate from the output terminal toward the pulse source are absorbed in the resistor which matches the characteristic impedance of the delay line and thus do not affect the pulse source or load circuit.

We claim:

1. A circuit for producing an output pulse having very fast rise and fall times, said circuit comprising first and second semiconductor devices, each having a junction about which the gradient of impurity concentration increases rapidly with distance therefrom, means to provide forward conduction current through the first and second semiconductor devices, said devices being capable of storing carriers in the immediate vicinity of the junctions thereof during forward conduction, circuit means responsive to an input signal to apply to the first semiconductor device a signal having sufficient amplitude and polartiy to oppose the forward conduction current therethrough, means including the first semiconductor device and responsive to the sudden depletion of stored carriers in the first semiconductor device to initiate the output pulse, said circuit means serving to apply to the second semiconductor device after a predetermined time a signal of sufficient amplitude and polarity to oppose the forward conduction current therethrough, means including the second semiconductor device and responsive to the sudden depletion of stored carriers in the second semiconductor device to terminate the output pulse, an output terminal, means to apply the output pulse to the output terminal, and means including the circuit means to establish forward conduction current through each of the first and second semiconductor devices at predetermined times subsequent to the application of the input signal.

2. A circuit for producing an output pulse having very fast rise and fall times, said circuit comprising first and second semiconductor devices, each having a junction about which the gradient of impurity concentration increases rapidly with distance therefrom, means to provide forward conduction current through the first and second semiconductor devices, said devices being capable of storing carriers in the immediate vicinity of the junctions thereof during forward conduction, circuit means responsive to an input signal to apply to the first semiconductor device a current having sufficient amplitude and direction to oppose the forward conduction current therethrough, means including the first semiconductor device and responsive to the sudden depletion of stored carriers therein to initiate the output pulse, said circuit means serving to apply to the second semiconductor device after a predetermined time a current having sufficient amplitude and direction to oppose the forward conduction current therethrough, means including the second semiconductor device and responsive to the sudden depletion of stored carriers therein to terminate the output pulse, an output terminal, means including a diode to apply the output pulse to the output terminal, said diode being connected to be forward biased during the interval between the initiation and termination of the output pulse, and means including the circuit means to establish forward conduction current through each of the first and second semiconductor devices at predetermined times subsequent to the application of the input signal.

3. A circuit for producing an output pulse having very fast rise and fall times, said circuit comprising first and second semiconductor devices, each having a junction about which the gradient of impurity concentration increases rapidly with distance therefrom, means to provide forward conduction current through the first and second semiconductor devices, said devices being capable of storing carriers in the immediate vicinity of the junctions thereof during forward conduction, circuit means responsive to an input signal to apply to the first semiconductor device a current having sufficient amplitude and direction to oppose the forward conduction current therethrough, means including the first semiconductor device and responsive to the sudden depletion of stored carriers therein to initiate the output pulse, said circuit means serving to apply to the second semiconductor device after a predetermined time a current having sufficient amplitude and direction to oppose the forward conduction current therethrough, means including the second semiconductor device and responsive to the sudden depletion of stored carriers therein to terminate the output pulse, an output terminal, means including a delay line having a predetermined delay time to apply the output pulse to the output terminal, and means including the circuit means to establish forward conduction current through each of the first and second semiconductor devices in a time that is less than twice the said delay time.

4. A circuit for producing an output pulse having very fast rise and fall times, said circuit comprising first and second semiconductor devices having junctions about which the gradients of impurity concentration increase rapidly with distance therefrom, means to provide forward conduction current through the first and second semiconductor devices, said devices being capable of storing supplies of carriers in the immediate vicinity of the junctions thereof during forward conduction, which supplies are proportional to the forward conduction currents therethrough, circuit means responsive to an input signal to apply to the first semiconductor device a current having an amplitude that increases with time, said current being applied in a direction to oppose the forward conduction current through the first semiconductor device, means including the first semiconductor device and responsive to the sudden depletion of the carriers stored in the first semiconductor device to initiate the output pulse, which depletion occurs when said current has a value that is substantially equal to the forward conduction current in the first semiconductor device, said circuit means being adapted to apply to the second semiconductor device after a preset time a current having an amplitude that increases with time, said current being applied in a direction to oppose the forward conduction current through the second semiconductor device, means including the second semiconductor device and responsive to the sudden depletion of the carriers stored in the second semiconductor device to terminate the output pulse, which depletion occurs when said current has a value that is substantially equal to the forward conduction current in the second semiconductor device, an output terminal, means including a diode and a delay line having one end terminated in the characteristic impedance thereof and being adapted to apply the output pulse to the output terminal, the delay time of said delay line being longer than said preset time, the circuit means being adapted to provide forward conduction current through each of the first and second semiconductor devices in predetermined times subsequent to the application of the input signal.

5. A circuit for producing an output pulse having very fast rise and fall times, said circuit comprising first and second semiconductor devices having junctions about which the gradients of impurity concentration increase rapidly with distance therefrom, means to provide forward conduction current through the first and second semiconductor devices, said devices being capable of storing supplies of carriers in the immediate vicinity of the junctions thereof during forward conduction, which supplies are proportional to the forward conduction currents therethrough, circuit means responsive to an input signal to apply to the first semiconductor device a current having an amplitude that increases with time, said current being applied in a direction to oppose the forward conduction current through the first semiconductor device, means including the first semiconductor device and responsive to the sudden depletion of the carriers stored in the first semiconductor device to initiate the output pulse, which depletion occurs when said current has a value that is substantially equal to the forward conduction current in the first semiconductor device, said circuit means being adapted to apply to the second semiconductor device after a present time a current having an amplitude that increases with time, said current being applied in a direction to oppose the forward conduction current through the second semiconductor device, means including the second semiconductor device and responsive to the sudden depletion of the carriers stored in the second semiconductor device to terminate the output pulse, which depletion occurs when said current has a value that is substantially equal to the forward conduction current in the second semiconductor device, an output terminal, means including a diode and a delay line to apply the output pulse to the output terminal, the delay time of said delay line being longer than said preset time, means to absorb reflections appearing in said delay line, said diode being rendered nonconductive before the reflections appear at the end of the delay line that is remote from said output terminal, the circuit means being adapted to provide forward conduction current through each of the first and second semiconductor devices in predetermined times subsequent to the application of the input signal.

6. A circuit for producing an output pulse having very fast rise and fall times of the order of a fraction of a millimicrosecond, said circuit comprising a logic circuit which produces first and second signals in response to an applied signal, the first and second signals having a predetermined time relationship to said input signal, first and second semiconductor devices having junctions about which the gradients of impurity concentration increase rapidly with distance therefrom, said first and second semiconductor devices being adapted to store carriers in the vicinities of the junctions thereof, first and second series circuits including an inductor and resistor to provide forward conduction currents of predetermined amplitudes through the first and second semiconductor devices respectively, first and second clipping circuits to limit to predetermined voltages the amplitudes of the first and second signals which are applied through said inductors to the first and second semiconductor devices respectively, signal conducting means to apply the first and second signals to the first and second clipping circuits respectively, the depletion of the carriers stored in the first semiconductor device being adapted to produce an abrupt change in the voltage thereacross, a first diode and resistor connected to receive the change in voltage appearing across the first semiconductor device, the depletion of the carriers stored in the second semiconductor device being adapted to produce an abrupt change in the voltage thereacross, a second diode and resistor connected to receive the change in voltage across the second semiconductor device, a third diode connected to receive the changes in the voltages appearing across the first and second semiconductor devices, a switch connected to receive the change in voltage appearing across one of the first and second resistors, an output terminal, means including a delay line connecting the switch and the output terminal, said delay line having a delay time that is longer than the predetermined time relationship between the first and second signals, means to absorb reflections appearing at the end of said delay line which is remote from the output terminal, and means to disconnect said remote end of the delay line prior to the appearance at said end of said reflections, the signal received by the switch being determined by the order in which the first and second signals appear.

References Cited in the file of this patent

UNITED STATES PATENTS 2,947,883 Welch ---------------- Aug. 2, 1960

OTHER REFERENCES

Hunter: Handbook of Semiconductor Electronics (1956), pages 4–22.